United States Patent [19]

Maley et al.

[11] Patent Number: 4,570,082
[45] Date of Patent: Feb. 11, 1986

[54] SINGLE CLOCKED LATCH CIRCUIT

[75] Inventors: Gerald A. Maley, Fishkill; Douglas W. Westcott, Wappingers Falls, both of N.Y.

[73] Assignee: International Business Machines Corporation, Armonk, N.Y.

[21] Appl. No.: 555,220

[22] Filed: Nov. 25, 1983

[51] Int. Cl.[4] .......................................... H03K 3/037
[52] U.S. Cl. .................................. 307/443; 307/269; 307/272 A; 307/291; 307/480
[58] Field of Search ............... 307/443, 480, 269, 291, 307/272 A, 608

[56] References Cited

U.S. PATENT DOCUMENTS

| | | | |
|---|---|---|---|
| 3,413,557 | 11/1968 | Muhlenbruch et al. | 328/92 |
| 3,603,815 | 9/1971 | Rao | 307/247 |
| 3,740,590 | 6/1973 | Hart et al. | 307/289 |
| 3,917,961 | 11/1975 | Reed | 307/272 A X |
| 4,002,933 | 1/1977 | Leuschner | 307/291 |
| 4,045,693 | 8/1977 | Ester | 307/445 X |
| 4,072,869 | 2/1978 | Gillow | 307/291 |
| 4,085,341 | 4/1978 | Reinert | 307/247 R |
| 4,160,173 | 7/1979 | Aoki | 307/289 |
| 4,277,699 | 7/1981 | Brown et al. | 307/291 X |
| 4,317,053 | 2/1982 | Shaw et al. | 307/269 |
| 4,334,157 | 6/1982 | Ferris | 307/291 |
| 4,439,690 | 3/1984 | Maley et al. | 307/480 X |

OTHER PUBLICATIONS

Hart et al., "Latch Circuit", IBM Tech. Disc. Bull., vol. 15, No. 1, Jun. 1972, p. 203.
Bodner, "100% Testable D-Type Flip-Flop", IBM Tech. Disc. Bull., vol. 15, No. 9, Jan. 1973, pp. 2487-2488.

Primary Examiner—Stanley D. Miller
Assistant Examiner—D. R. Hudspeth
Attorney, Agent, or Firm—Robert J. Haase

[57] ABSTRACT

An edge triggered polarity hold, clocked latch circuit is disclosed which requires the use of only a single clock line for operation. The latch circuit comprises three set-reset type latches. Each of two latches receives one set and one reset signal. The third latch receives two reset signals and one set signal. A single clock signal is applied jointly to a reset terminal of the third latch and of one of the first two latches. A data signal is applied to the set terminal of the third latch. The other of the first two latches constitutes the output latch and is connected to receive the outputs of the remaining latches. The output latch produces an output equal to an input data signal upon each occurrence of the leading edge of an input clock signal. The output is held (latched) until the occurrence of the next clock signal when the output becomes equal to the then existing input data signal.

6 Claims, 1 Drawing Figure

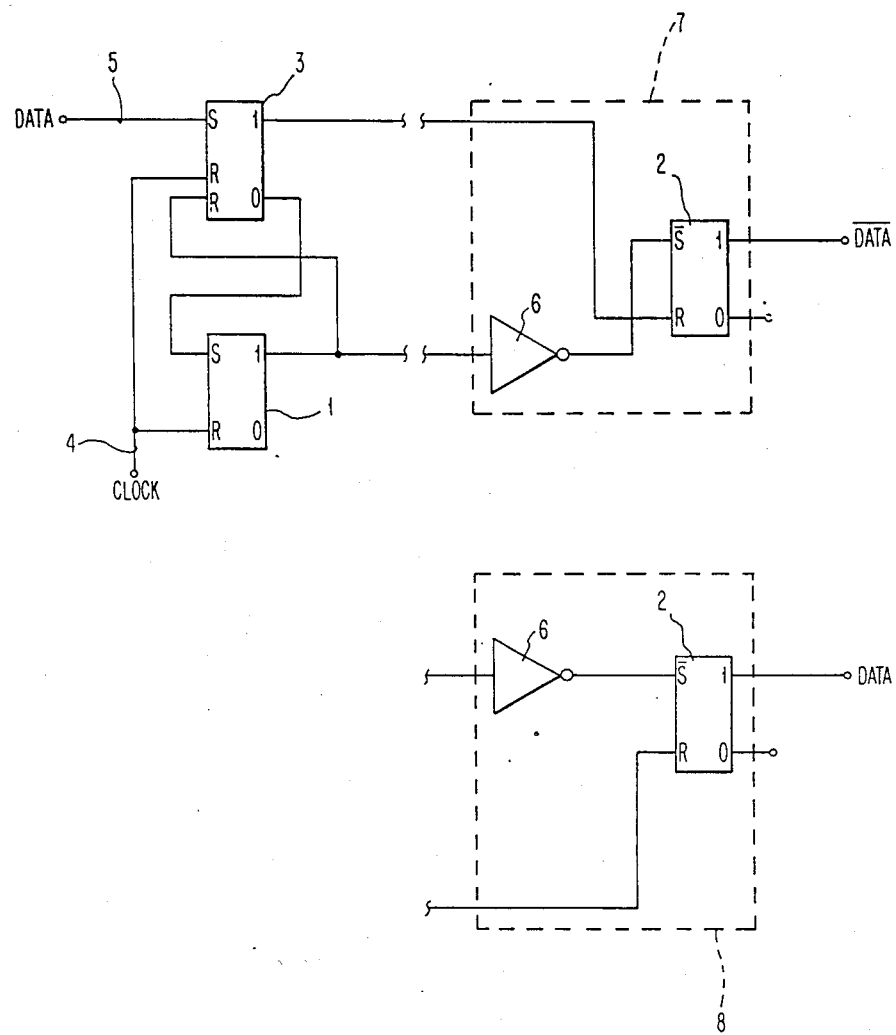

SINGLE CLOCKED LATCH CIRCUIT

TECHNICAL FIELD

This invention generally relates to clocked latch circuits and more particularly, to such circuits of the edge triggered, polarity hold type characterized by requiring only a single clock pulse for operation.

BACKGROUND ART

Clocked latching circuits are widely used in computer sequential logic circuits. For properly timed operation, such circuits require timing or clocking signal inputs. The edge triggered polarity hold latch is a commonly used circuit type which detects the polarity of the input data signal at the moment of occurrence of the edge of the clock input signal. The circuit produces an output signal which is equal to the input data signal each time that the leading edge occurs of the input clock signal. The output signal remains fixed (latched) at that value until the occurrence of the next clock signal when the output signal becomes equal to the then existing data signal input.

All known prior art circuits of such type require the use of two non-overlapping clock signals for proper operation. Either the two clock signals are centrally generated and routed to the individual latches or the second clock signal is locally generated within each latch (as by means of a delay element) from a centrally generated first clock signal which is routed to the individual latches. Each of these two techniques entails speed disadvantages especially in high performance computers. A plurality of clock signals that can not be overlapped wastes valuable time in high performance machines.

U.S. Pat. No. 3,413,557, Gated Strobing Latch for Synchronizing Data in an Asynchronous System, G. R. Muhlenbruch et al., Nov. 26, 1968 and assigned to the assignee of the present invention, discloses a dual clock phase, edge triggered, polarity hold latch which is an example of the prior art described above wherein two clock signals are utilized, the second clock signal being locally generated, using a delay, from a centrally generated first clock signal.

Accordingly, it is desirable to devise a single clocked circuit of the type described.

SUMMARY OF THE INVENTION

An edge triggered, polarity hold, single clocked latch circuit which produces an output equal to an input data signal upon each occurrence of the leading edge of an input clock signal is described. The output is held (latched) until the occurrence of the next clock signal when the output becomes equal to the then existing input data signal.

The latch circuit comprises three set-reset type latches. Each of two latches receives one set and one reset signal. The third latch receives two reset signals and one set signal. A single clock signal is applied jointly to a reset terminal of the third latch and of one of the first two latches. A data signal is applied to the set terminal of the third latch. The other of the first two latches constitutes the output latch and is connected to receive the outputs of the remaining latches. The output latch operates to store the last value of the data input signal while the clock line is up.

BRIEF DESCRIPTION OF THE DRAWING

The sole FIGURE is a schematic diagram of an embodiment of the invention showing two alternative connections between the output latch and the other two latches.

BEST MODE FOR CARRYING OUT THE INVENTION

The single clocked latch circuit of the present invention can be represented using three conventional set-reset type latches 1, 2 and 3 as shown in the FIGURE. Set-reset latches 1 and 3 are well known in the art and are described on page 242 of the book "Manual of Logic Circuits" by Gerald A. Maley, Prentice-Hall, Inc., 1970. It should be noted that latch 3 is provided with an additional reset (R) input terminal. Latch 2 makes use of a wired AND connective and responds to a complementary set input (S). It is described on page 243 of the aforesaid book. Latch 2 stores the present value contained in the latch circuit and is isolated from change for the time duration that the input clock line 4 is up. Latches 1 and 3 perform several other functions and are cross-connected to each other, with the one (non-inventing) output of latch 1 being connected to one of the reset inputs of latch 3 and the zero (inverting) output of latch 3 being connected to the set input of latch 1.

In operation, clock line 4 normally is up, maintaining the one outputs of latches 1 and 3 at zero. This condition enables latch 2 to retain either a one or a zero, as the case may be. When the clock line 4 is up, the zero outputs of latches 1 and 3 change with the signal on data line 5. The zero output of latch 3 is the complement of the signal on data line 5 which is connected to the set input of the latch. The zero output of latch 3 is connected directly to the set input of latch 1. Thus, output zero from latch 1 is the same as the value of the data line signal, inasmuch as additional complementing takes place in latch 1 between the set input and zero output therefrom.

Assuming that the data line 5 signal is stabilized at a one value, the zero output of latch 1 is a one and the zero output of latch 3 is a zero. Latches 1 and 3 now have been prepared to hold the value of the data line 5 signal upon the lowering of the clock line 4.

When the clock line 4 is lowered, the reset inputs to latches 1 and 3 are lowered and the one outputs of latches 1 and 3 are no longer held at zero value. Latch 3 is set to the one value of the signal on data line 5 and its one output changes to a one. The zero output of latch 3 does not change when the clock line 4 is lowered and so latch 1 remains reset with its one output being a zero and its zero output being a one.

Two alternative connections of latch 2 to the one outputs of latches 1 and 3 are shown. In the upper example 7 in the drawing, the one output of latch 3 is directly connected to the reset input of latch 2 while the one output of latch 1 is connected via inverter 6 to the complementary set input of latch 2. In the case just described, wherein the data line 5 signal is stabilized at a one value and the clock line 4 is lowered, latch 2 is reset to a zero (the complement of the data line signal). If the reversed connections shown in the lower example 8 in the drawing were effected, latch 2 would be set to a one value (the same as the data line signal). It should be noted that the data line now is free to change without affecting the output from latch 2.

The inverse situation obtains when the data line stabilizes at a zero (rather than a one) and the clock line is lowered. As before, while the clock line still is up, the one outputs of latches 1 and 3 are zeroes and the zero outputs of latches 1 and 3 are ones. As the clock line is lowered, however, the reset inputs to latches 1 and 3 are lowered and the one outputs are no longer held at zero. Latch 3 remains reset with its one output being a zero and its zero output being a one. Latch 1 becomes set causing its one output to change to a one value.

The one output value from latch 1, when applied to latch 2 via the upper example 7 connections shown in the FIGURE, causes latch 2 to be set to a one (complement of the data line value). The use of the connections shown in the lower example 8 in the FIGURE causes latch 2 to be reset to a zero (equal to the data line value).

We claim:

1. A latch circuit having an output terminal, said circuit comprising first, second and third set-reset latches, said first and second latches each having one set and one reset input terminals, and a non-inverting and an inverting output terminals, said second latch being equipped to receive a complementary set signal at its set input terminal, said third latch having first and second reset and one set input terminals, and non-inverting and an inverting output terminals, said non-inverting output terminal of said first latch being connected to said first reset terminal of said third latch, said inverting output terminal of said third latch being connected to said set input terminal of said first latch, a data signal being applied to said set input terminal of said third latch, a clock signal being applied to said second reset terminal of said third latch and to said reset terminal of said first latch, and means including an inverter for connecting said non-inverting output terminals of said third and first latches to respective ones of said set and reset input terminals of said second latch.

2. The latch circuit defined in claim 1 wherein said non-inverting output terminals of said third and first latches are connected to said reset and said set input terminals of said second latch, respectively.

3. The latch circuit defined in claim 2 wherein said set input terminal of said second latch is characterized by receiving a complementary set signal, and an inverter, said non-inverting output terminal of said first latch being connected to said set input terminal of said second latch via said inverter.

4. The latch circuit defined in claim 1 wherein said non-inverting output terminals of said third and first latches are connected to said set and said reset input terminals of said second latch, respectively.

5. The latch circuit defined in claim 4 wherein said set input terminal of said second latch is characterized by receiving a complementary set signal, and an inverter, said non-inverting output terminal of said third latch being connected to said set input terminal of said second latch via said inverter.

6. The latch defined in claim 1 wherein said non-inverting output terminal of said second latch is said output terminal of said latch circuit.

* * * * *